(12) United States Patent
Disney

(10) Patent No.: US 7,977,742 B1
(45) Date of Patent: Jul. 12, 2011

(54) TRENCH-GATE MOSFET WITH CAPACITIVELY DEPLETED DRIFT REGION

(75) Inventor: Donald R. Disney, Cupertino, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 0 days.

(21) Appl. No.: 12/860,766

(22) Filed: Aug. 20, 2010

(51) Int. Cl.
*H01L 29/78* (2006.01)
(52) U.S. Cl. ............... 257/332; 257/E29.257; 438/272
(58) Field of Classification Search .......... 438/270–272; 257/E29.257, 330–334
See application file for complete search history.

(56) References Cited

U.S. PATENT DOCUMENTS

| | | | |
|---|---|---|---|
| 6,008,520 A | 12/1999 | Darwish et al. | |
| 6,331,456 B1 | 12/2001 | Wu | |
| 6,555,873 B2 * | 4/2003 | Disney et al. | 257/342 |
| 6,635,544 B2 | 10/2003 | Disney | |
| 6,750,105 B2 | 6/2004 | Disney | |
| 6,838,346 B2 | 1/2005 | Disney | |
| 6,900,091 B2 | 5/2005 | Williams et al. | |
| 6,943,426 B2 | 9/2005 | Williams et al. | |
| 7,227,225 B2 * | 6/2007 | Ono et al. | 257/331 |
| 7,253,042 B2 | 8/2007 | Disney | |
| 7,422,938 B2 | 9/2008 | Williams et al. | |
| 7,489,016 B2 | 2/2009 | Williams et al. | |
| 7,652,326 B2 | 1/2010 | Kocon | |
| 7,701,033 B2 | 4/2010 | Williams et al. | |
| 7,719,054 B2 | 5/2010 | Williams et al. | |
| 7,737,526 B2 | 6/2010 | Williams et al. | |
| 7,741,661 B2 | 6/2010 | Disney et al. | |
| 7,745,291 B2 | 6/2010 | Disney et al. | |

OTHER PUBLICATIONS

Power MOSFET—from Wikipedia, the free encyclopedia, pp. 1-10 [retrieved on Jul. 3, 2010], retrieved from the internet: http://en.wikipedia.org/wiki/Power_MOSFET.
Power semiconductor device—from Wikipedia, the free encyclopedia, pp. 1-6 [retrieved on Jul. 2, 2010], retrieved from the internet: http://en.wikipedia.org/wiki/Power_semiconductor_device.

\* cited by examiner

*Primary Examiner* — Matthew Smith
*Assistant Examiner* — Daniel Shook
(74) *Attorney, Agent, or Firm* — Okamoto & Benedicto LLP

(57) ABSTRACT

A trench-gate metal oxide semiconductor field-effect transistor (MOSFET) includes a field plate that extends into a drift region of the MOSFET. The field plate, which is electrically coupled to a source region, is configured to deplete the drift region when the MOSFET is in the OFF-state. The field plate extends from a top surface of a device substrate, which comprises an epitaxial layer formed on a silicon substrate. The field plate has a depth greater than 50% of a thickness of the epitaxial layer. For example, the field plate may extend to a full depth of the drift region. The field plate allows for relatively easy interconnection from the top surface of the device substrate, simplifying the fabrication process.

24 Claims, 3 Drawing Sheets

TRENCH-GATE MOSFET WITH CAPACITIVELY DEPLETED DRIFT REGION

BACKGROUND OF THE INVENTION

1. Field of the Invention

The present invention relates generally to semiconductor devices, and more particularly but not exclusively to power transistors.

2. Description of the Background Art

Power transistors are employed in a variety of applications requiring high power dissipation, including power supplies, DC-DC converters, and motor control, to name a few examples. Power transistors are selected for a given application based on their ON-state, switching, and OFF-state characteristics. The design of a power transistor often involves trade-offs among the aforementioned characteristics. For example, in a typical power metal oxide semiconductor field-effect transistor (MOSFET), the drift region is lightly doped to achieve a high breakdown voltage. However, a lightly doped drift region results in a high ON-state resistance.

The following disclosure pertains to a power transistor that achieves relatively low ON-state loss and switch loss for a given breakdown voltage. Advantageously, the power transistor allows for relatively easy fabrication.

SUMMARY

In one embodiment, a trench-gate metal oxide semiconductor field-effect transistor (MOSFET) includes a field plate that extends into a drift region of the MOSFET. The field plate, which is electrically connected to a source region, is configured to deplete the drift region when the MOSFET is in the OFF-state. The field plate extends from a top surface of a device substrate, which may comprise an epitaxial layer formed on a silicon substrate. The field plate has a depth greater than 50% of a thickness of the epitaxial layer. For example, the field plate may extend to a full depth of the drift region. The field plate allows for relatively easy interconnection from the top surface of the device substrate, simplifying the fabrication process.

These and other features of the present invention will be readily apparent to persons of ordinary skill in the art upon reading the entirety of this disclosure, which includes the accompanying drawings and claims.

The use of the same reference label in different drawings indicates the same or like components. The drawings are not drawn to scale.

DETAILED DESCRIPTION

In the present disclosure, numerous specific details are provided, such as examples of materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention. For example, masking steps, metal interconnects, and electrodes not necessary to the understanding of the invention are omitted in the interest of clarity.

Figure 1:
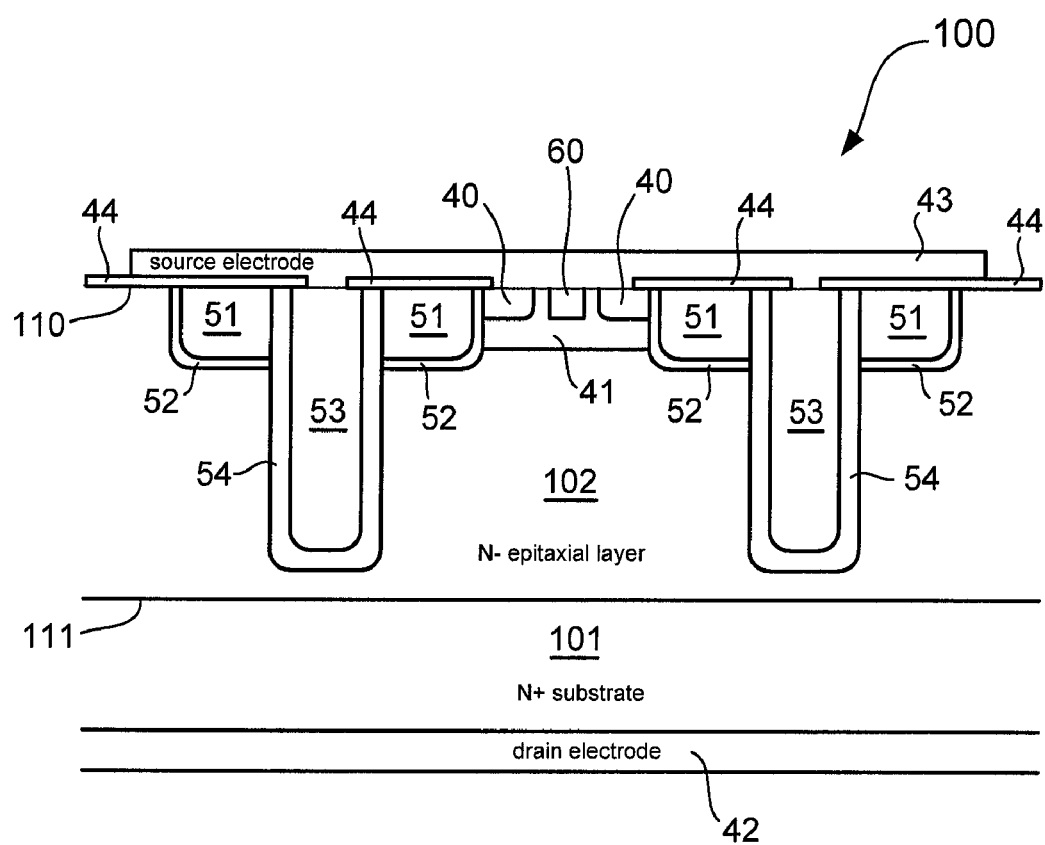
FIG. 1 schematically shows a transistor in accordance with an embodiment of the present invention.

FIG. 1 schematically shows a transistor in the form of a power MOSFET 100 in accordance with an embodiment of the present invention. The power MOSFET 100 comprises N+ source regions 40 and gates 51. An N− epitaxial layer 102 is formed on an N+ silicon substrate 101, which serves as the drain of the power MOSFET 100. A source electrode 43 electrically connects the N+ source regions 40 and field plates 53. An interlevel dielectric layer 44 (e.g., silicon dioxide, silicon nitride, or other suitable material) provides electrical insulation between the source electrode 43 and the gates 51.

A drain electrode 42 electrically connects to the drain. A gate electrode (not shown) electrically connects to the gates 51. The source electrode 43, drain electrode 42, and the gate electrode, each of which may comprise a metal, allow an external electrical circuit to connect to the power MOSFET 100.

The power MOSFET 100 is a so-called trench-gate MOSFET in that a gate 51 is formed in a gate trench. A gate 51 comprises a conductive material, such as doped polysilicon. A gate dielectric 52 is formed in the gate trench and comprises an insulating material such as silicon dioxide. The gate dielectric 52 vertically separates the bottom of the gate 51 from the drift region, which in this example comprises the portion of the N− epitaxial layer 102 between the top of the N+ substrate 101 and the bottom of body region 41 or the bottom of gate 51.

Each of the field plates 53 serves as a second gate that extends into the drift region. A field plate 53 comprises a conductive material, such as doped polysilicon, formed in a field plate trench. A relatively thick field plate dielectric 54 is formed in the field plate trench, and separates the field plate 53 from the drift region. The field plate trench extends substantially deeper than gates 51 and may extend all the way into N+ substrate 101. For example, the field plates 53 preferably have a depth greater than 50% of the thickness of the drift region.

A field plate dielectric 54 may comprise one or more dielectric materials, such as thermal and/or deposited silicon dioxide, for example. For a given breakdown voltage, the field plate dielectric 54 is relatively thicker than a gate dielectric 52. The field plate dielectric 54 has substantially the same thickness along the sidewalls of the field plate trench, including from the top of the device substrate and past below the bottom surface of the gate dielectric 52. The gates 51 are outside of and extend laterally beyond adjacent field plate trench and field plate dielectric 54.

In the OFF-state (i.e., when the power MOSFET 100 is switched OFF), the field plate 53 depletes the drift region by capacitive action. This capacitive depletion advantageously allows for a higher doping level in the drift region than would normally be possible for a given breakdown voltage. The higher drift region doping provides significantly lower ON-state (i.e., when the power MOSFET 100 is switched ON) resistance, advantageously resulting in lower ON-state loses. Moreover, depletion of the drift region by the field plates 53, which are tied to source potential, shields the gate 51 from high drain voltages. This advantageously reduces drain-gate capacitance or gate charge (Qgd) for improved switching performance.

The doping in the drift region is preferably graded, with the highest doping concentration near the bottom surface 111 of the N− epitaxial layer 102 and the lowest doping concentration near the bottom of body region 41. In one embodiment, the doping concentration changes substantially linearly with vertical position in the drift region. This advantageously allows for substantially constant electric field along the entire length of the drift region when it is depleted by capacitive action of the field plates 53 during the OFF-state.

The field plates 53 are formed in field plate trenches that directly extend vertically all the way to the top surface 110, allowing for ease of connectivity to a conventional metallization layer, which in this example comprises the source electrode 43.

Each of the gates 51 is formed laterally adjacent to a field plate 53. In the example of FIG. 1, a field plate dielectric 54 (not a gate dielectric 52) separates a field plate 53 from a gate 51. Note that a field plate dielectric 54 extends deeper into the drift region compared to a gate dielectric 52. Adjacent gates 51 are separated by a portion of the N− epitaxial layer 102 comprising a body region 41 having conductivity opposite to that of the N+ substrate 101 and N− epitaxial layer 102. Accordingly, in the example of FIG. 1, the body region 41 is P-type. A body contact region 60, having a same conductivity type as the body region 41, may be formed adjacent the surface of body region 41 to provide better electrical contact to source electrode 43. A relatively thin dielectric, which in this example comprises a gate dielectric 52, separates a gate 51 from the body region 41. Adjacent a gate dielectric 52 is a source region of the same doping type as the device substrate. Accordingly, in the example of FIG. 1, the source regions comprise N+ source regions 40.

As can be appreciated, the conductivity and doping of the materials/regions disclosed herein may be varied, with appropriate changes to the conductivity of other materials/regions, depending on the application. For example, when the device substrate is P-type, the source regions 50 are P+ source regions and the body regions 41 are N-type.

In the ON-state, the power MOSFET 100 operates similar to a conventional vertical trench-gate MOSFET. More specifically, the power MOSFET 100 is switched ON by applying a positive voltage greater than the threshold voltage on a gate 51, creating an inversion layer, or channel, along the interface of a gate dielectric 52 and body region 41. This allows electron current to flow from an N+ source region 40 through the channel in body region 41 and into the drift region. Electron current in the drift region continues flowing to the N+substrate 101 and to the drain electrode 42. In the OFF-state, the gate voltage is reduced so that there is no channel for electron current to flow. A positive drain voltage is applied relative to the source, gate, and field plate voltages, which are all substantially at the same potential. The PN junction between P-type body region 41 and N− epitaxial layer 102 is reverse biased. This reverse-biased junction and capacitive action from the gates 51 and field plates 53 cause depletion of the N− epitaxial layer 102 (i.e. the drift region), allowing the device to support high voltage between the drain and source.

FIGS. 2-5 show cross-sections schematically illustrating the fabrication of a power MOSFET 100 in accordance with an embodiment of the present invention. As can be appreciated, process steps not necessary to the understanding of the invention have been omitted in the interest of clarity.

Figure 2:
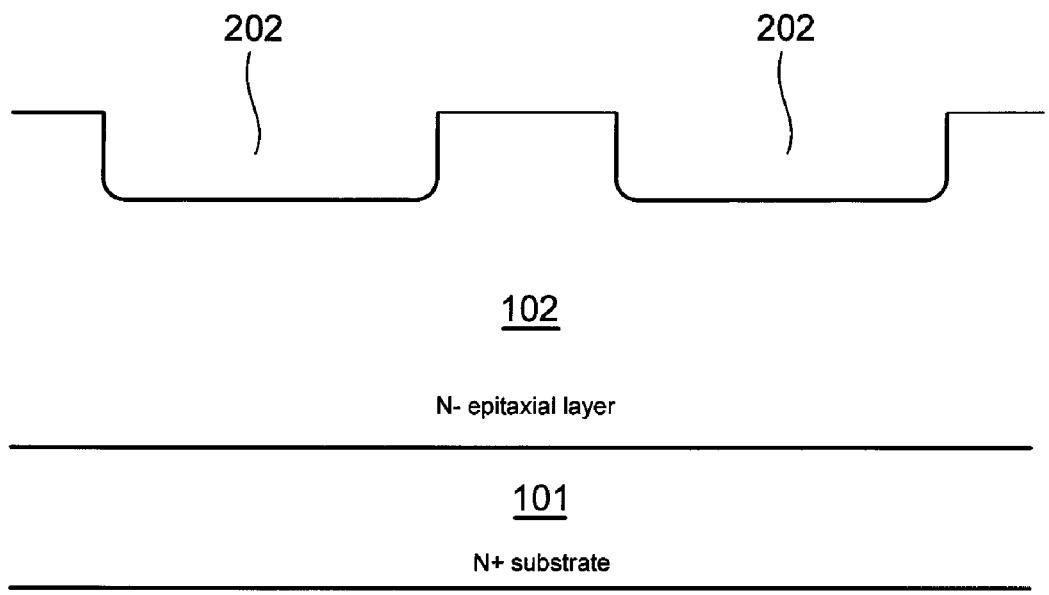
FIGS. 2-5 show cross-sections schematically illustrating the fabrication of a transistor in accordance with an embodiment of the present invention.

In FIG. 2, an N− epitaxial layer 102 is grown on an N+ substrate 101. In one embodiment, the N+ substrate 101 comprises a silicon substrate. The N− epitaxial layer 102 may be grown by vapor phase epitaxy, for example. The thickness and doping profile of N− epitaxial layer 102 are chosen to provide a drift region with the desired off-state characteristics (e.g. breakdown voltage). For example, a device with a breakdown voltage of 100V may have an N− epitaxial layer thickness in the range of 5 to 15 microns and a doping profile with a concentration in the range of $5 \times 10^{16}$ cm$^{-3}$ to $5 \times 10^{17}$ cm$^{-3}$ near the N+ substrate 101, a concentration in the range of $5 \times 10^{15}$ cm$^{-3}$ to $5 \times 10^{16}$ cm$^{-3}$ near the bottom of the (subsequently introduced) body region, and a concentration in the range of $5 \times 10^{15}$ cm$^{-3}$ to $5 \times 10^{16}$ cm$^{-3}$ at a top surface of N− epitaxial layer 102. In one embodiment, the doping concentration of N− epitaxial layer 102 decreases in a substantially linear fashion with vertical position between the top of N+ substrate 101 and the bottom of the body region, then remains substantially constant with vertical position from the bottom of the body region to the top surface.

Gate trenches 202 are formed in the N− epitaxial layer 102 by reactive ion etching, for example. The depth of gate trenches 202 is chosen to be greater than the depth of subsequently formed body region 60 (see FIG. 1) such that, in the ON-state, a channel may be fully formed along the entire vertical extent of the body region 60. By way of example, the gate trenches 202 may have a depth in the range of 1 to 2 microns.

Figure 3:
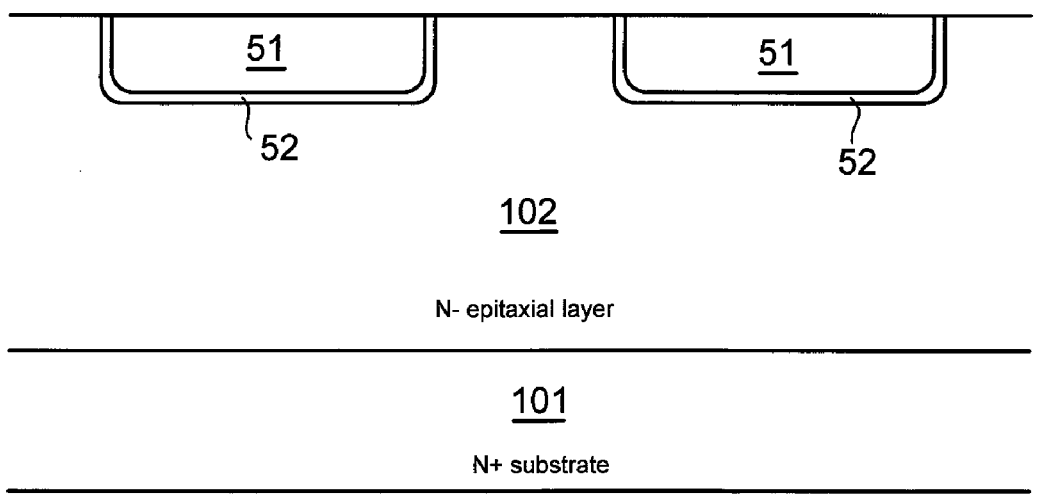

In FIG. 3, gate dielectrics 52 are formed in the gate trenches 202. Prior to gate dielectric formation, the surface quality of the gate trenches may be improved by a sacrificial oxidation and oxide etching. Gate dielectric 52 may comprise one or more suitable dielectric materials. In a preferred embodiment, thermal oxide is grown on the surface of a gate trench 202. The thickness of gate dielectric 52 is chosen to support the desired gate-to-source operating voltage. For example, a thermal oxide with a thickness in the range of 150 to 450A may be used.

Following formation of gate dielectric 52, gate material is deposited in each of the gate trenches 202 to form gates 51. The gate material may comprise any conductive material, such as doped polysilicon, a silicide, or metal. In a preferred embodiment, doped polysilicon forms gates 51. Gate trenches 202 are completely filled and then the excess polysilicon on the surface of the N− epitaxial layer 102 is removed such that the surface is substantially planarized. This may be accomplished, for example, by etch-back and/or chemical mechanical planarization (CMP).

Figure 4:
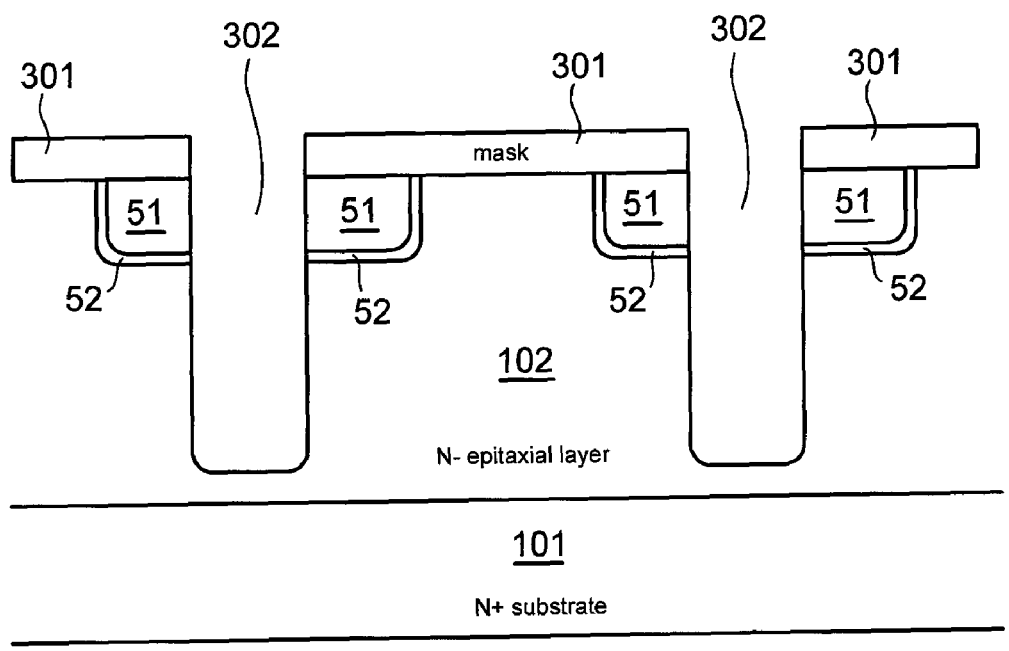

In FIG. 4, field plate trenches 302 are formed in the N− epitaxial layer 102. The field plate trenches 302 may be formed by forming a mask 301 on the top surface of the N− epitaxial layer 102 to define the field plate trenches 302, and then etching through the gate 51, through the gate dielectric 52, and into N− epitaxial layer 102. The depth of the field plate trenches 302 is chosen, in combination with the N− epitaxial layer thickness and doping, to provide the desired OFF-state characteristics. Deeper field plate trenches provide device performance benefits (reduced drift region resistance and shielding of the gate regions), at the expense of more complex processing (deeper trenches are more difficult to etch and refill). By way of example, the depth of the field plate trenches may be in the range of two times the depth of gate trenches 202 to a few microns more than the thickness of N− epitaxial region 102 (that is, extending all the way into N+ substrate 101). In one embodiment, the field plate trench depth is at least one-half the thickness of N− epitaxial region 102.

Figure 5:
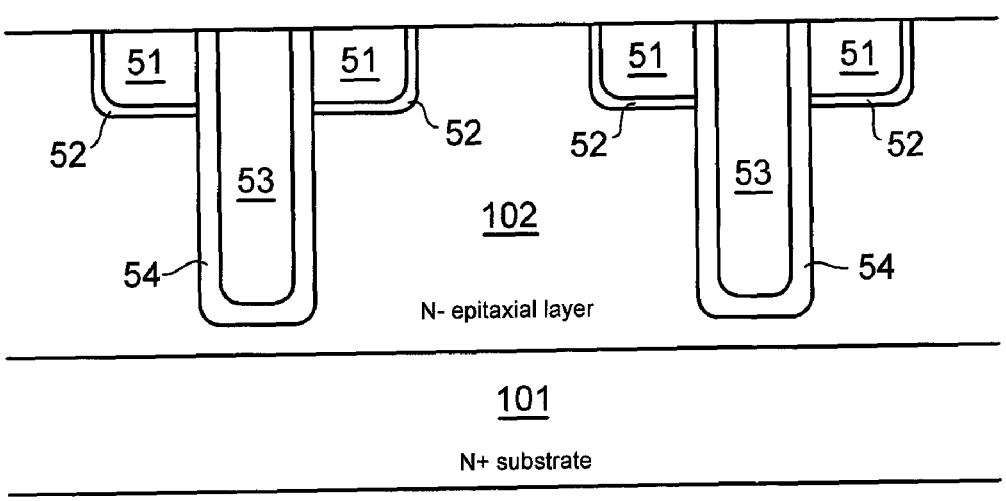

In FIG. 5, the mask 301 is removed and field plate dielectrics 54 are formed in the field plate trenches 302. A field plate dielectric 54 may comprise any suitable dielectric material. In some example embodiments, a thermally grown oxide, a deposited oxide (e.g. LPCVD TEOS), or a combination of these layers are used to form field plate dielectric 54. The thickness of field plate dielectric 54 is chosen to support the desired drain-to-source operating voltage. For example, a thickness in the range of 0.2 to 1.0 microns may be used for a device with a breakdown voltage of 100V.

Following formation of field plate dielectrics 54, field plate material is deposited in each of the field plate trenches 302 to form field plates 53. The field plate material may comprise any conductive material, such as doped polysilicon, a silicide, or metal. In a preferred embodiment, doped polysilicon is used. In the example of FIG. 5, the gates 51 are outside of and laterally extend beyond an adjacent field plate trench 302 and field plate dielectric 54. Field plate trenches 302 are completely filled and then the excess field plate material on the surface of the N– epitaxial layer 102 is removed such that the surface is substantially planarized. This may be accomplished, for example, by etch-back and/or chemical mechanical planarization (CMP).

Additional steps, not shown, follow after FIG. 5 to form the structure of the power MOSFET 100 shown FIG. 1. These additional steps include formation of the body regions 41, body contact region 60, and source regions 40. These regions may be formed by conventional masking and ion-implantation techniques. In some embodiments, one or more of these regions may be formed earlier in the process (e.g. before formation of the gate trenches or the field plate trenches). An interlevel dielectric layer (ILD) 44 is deposited and patterned on the top surface of the N– epitaxial layer 102 using conventional techniques. ILD 44 may comprise any suitable dielectric material, such as silicon nitride and/or silicon dioxide. One or more metallization layers (e.g. aluminum, copper, silicide, or the like) are deposited and patterned using conventional techniques to form the source electrode 43 and gate electrode (not shown) on the top surface. A passivation layer (not shown) may be deposited and patterned to protect the top metallization layer. The N+ substrate may be thinned from the backside and then a metallization layer deposited on the back of the substrate to form drain electrode 42.

An improved trench-gate MOSFET with capacitively depleted drift region has been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A transistor comprising:
    a gate formed in a gate trench in a device substrate, the gate being outside of and extending laterally beyond a field plate dielectric, the gate having a bottom that extends into a drift region of the transistor, the gate being vertically separated from the drift region and laterally separated from a body region of the transistor by a gate dielectric;
    a source region;
    a field plate extending vertically from a top surface of the device substrate and into the drift region, the gate being disposed laterally adjacent to the field plate, the field plate being separated from the drift region by the field plate dielectric, the field plate dielectric being thicker than the gate dielectric formed in the gate trench, the field plate being electrically coupled to the source region and configured to deplete the drift region by capacitive action when the transistor is switched OFF.

2. The transistor of claim 1 wherein the device substrate comprises an epitaxial layer formed on a silicon substrate.

3. The transistor of claim 2 wherein the field plate has a depth that is greater than 50% of a thickness of the epitaxial layer.

4. The transistor of claim 1 wherein the field plate trench extends to a full depth of the drift region.

5. The transistor of claim 1 wherein the field plate comprises doped polysilicon.

6. The transistor of claim 1 further comprising a source electrode electrically coupling the field plate to the source region.

7. A method of fabricating a transistor, the method comprising:
    forming an epitaxial layer on a silicon substrate;
    forming a gate trench in the epitaxial layer;
    forming a gate dielectric in the gate trench;
    filling the gate trench with a conductive material to form a gate;
    forming a field plate trench that extends into a drift region of the transistor and through and past the gate and the gate dielectric;
    forming a field plate dielectric in the field plate trench; and
    filling the field plate trench with a conductive material to form a field plate that extends vertically into the drift region.

8. The method of claim 7 further comprising planarizing a top surface of the epitaxial layer after forming the field plate to remove excess conductive material.

9. The method of claim 7 wherein the field plate comprises doped polysilicon.

10. The method of claim 7 further comprising:
    electrically shorting the field plate trench to a source region.

11. The method of claim 7 wherein the field plate dielectric comprises deposited oxide.

12. The method of claim 7 wherein the field plate dielectric is thicker than the gate dielectric.

13. The method of claim 7 wherein the field plate trench extends substantially to a bottom surface of the epitaxial layer.

14. A transistor comprising:
    a device substrate comprising an epitaxial layer formed on a silicon substrate;
    a source region;
    a gate formed in a gate trench in the epitaxial layer, the gate being outside of and laterally extending beyond a field plate dielectric, the gate extending into a drift region of the transistor;
    a gate oxide formed in the gate trench, the gate oxide laterally separating the gate from a body region and vertically separating the gate from a the drift region of the transistor; and
    a field plate formed in a field plate trench that extends into the drift region, the field plate trench extending all a way to a top surface of the device substrate, the field plate being electrically coupled to the source region and separated from the drift region by the field plate dielectric, the field plate dielectric being thicker than the gate oxide, the gate being disposed laterally adjacent to the field plate, the field plate being configured to capacitively deplete the drift region when the transistor is in the OFF-state.

15. The transistor of claim 14 wherein the field plate dielectric and the gate oxide comprise thermal oxide.

16. The transistor of claim 14 wherein the gate and the field plate comprise doped polysilicon.

17. The transistor of claim 14 wherein the epitaxial layer, the silicon substrate, and the source region have N-type conductivity.

18. The transistor of claim 14 wherein doping concentration of the drift region is graded to have a highest doping concentration from an interface between the epitaxial layer and the silicon substrate and a lowest doping concentration on the top surface of the device substrate.

19. The transistor of claim 14 wherein the field plate extends substantially a full depth of the drift region.

20. The transistor of claim 14 further comprising an inter-level dielectric layer formed over the top surface of the device substrate and between a source electrode and the gate, the source electrode shorting the field plate to the source region.

21. A transistor comprising:
  a device substrate of a first conductivity type comprising a drain region;
  a source region of the first conductivity type formed near a top surface of a device substrate;
  a body region of a second conductivity type, opposite to that of the first conductivity type, formed below the source region and having a first depth in the device substrate;
  a drift region vertically separating the body region from the drain region;
  a field plate extending vertically from the top surface of the device substrate to a second depth;
  a gate region extending vertically from the top surface of the device substrate to a third depth, the third depth being greater than the first depth and less than the second depth, the gate region being disposed laterally between the field plate and the body region, the gate region extending into the drift region and being vertically separated from the drift region by a gate dielectric.

22. The transistor of claim 21 wherein the gate dielectric laterally separates the gate region from the source region and the body region, and further comprising a field plate dielectric laterally separating the field plate from the drift region and the gate region, the field plate dielectric being substantially thicker than the gate dielectric, the gate region laterally extending beyond the field plate dielectric.

23. The transistor of claim 21 further comprising:
  a body contact region of the second conductivity type formed in the body region adjacent the top surface of the device substrate;
  a source electrode formed above the top surface of the device substrate and in electrical contact with the body contact region, the source region, and the field plate.

24. The transistor of claim 21 wherein the field plate extends all the way through the drift region and into the drain region.

* * * * *